US012787449B2

(12) United States Patent
Lai et al.

(10) Patent No.: US 12,787,449 B2
(45) Date of Patent: Nov. 3, 2026

(54) EMBEDDED CLAMPING DIODE TO IMPROVE DEVICE RUGGEDNESS

(71) Applicant: Taiwan Semiconductor Manufacturing Company, Ltd., Hsinchu (TW)

(72) Inventors: Yu-Ying Lai, Changhua County (TW); Po-Chih Su, New Taipei City (TW); Ruey-Hsin Liu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 656 days.

(21) Appl. No.: 18/297,182

(22) Filed: Apr. 7, 2023

(65) Prior Publication Data

US 2024/0339446 A1 Oct. 10, 2024

(51) Int. Cl.

| | |
|---|---|
| ***H10D 30/01*** | (2025.01) |
| ***H10D 62/10*** | (2025.01) |
| ***H10D 84/00*** | (2025.01) |
| ***H10D 84/01*** | (2025.01) |
| ***H10D 84/03*** | (2025.01) |
| ***H10D 89/60*** | (2025.01) |
| *H03K 17/081* | (2006.01) |

(52) U.S. Cl.

CPC ....... *H10D 89/611* (2025.01); *H10D 30/0285* (2025.01); *H10D 62/102* (2025.01); *H10D 84/0156* (2025.01); *H10D 84/038* (2025.01); *H10D 84/153* (2025.01); *H10D 89/931* (2025.01); *H03K 17/08104* (2013.01)

(58) Field of Classification Search

None

See application file for complete search history.

(56) References Cited

U.S. PATENT DOCUMENTS

| | | | | |
|---|---|---|---|---|
| 9,978,846 B2 | 5/2018 | Lian | | |
| 10,756,079 B2 | 8/2020 | Sheu et al. | | |
| 2007/0114607 A1 | 5/2007 | Pendharkar | | |
| 2008/0067588 A1 | 3/2008 | Williams et al. | | |
| 2014/0001546 A1* | 1/2014 | Bode | H01L 21/02381 | 257/E21.544 |
| 2015/0048449 A1* | 2/2015 | Jeon | H10D 62/157 | 257/337 |
| 2015/0243780 A1* | 8/2015 | Lin | H10D 62/153 | 438/286 |
| 2017/0092760 A1 | 3/2017 | Parris et al. | | |
| 2019/0371939 A1* | 12/2019 | Wang | H01L 21/761 | |
| 2019/0378721 A1 | 12/2019 | Park | | |
| 2022/0140140 A1 | 5/2022 | Li et al. | | |

* cited by examiner

*Primary Examiner* — Xiaoming Liu

(74) *Attorney, Agent, or Firm* — Eschweiler & Potashnik, LLC

(57) ABSTRACT

Damage to an LDMOS transistor from voltage overshoot in a power switching circuit operating at high switching speeds is prevented by embedding a diode under a drain region of the LDMOS transistor. The embedded diode is doped more heavily than a drift region of the LDMOS transistor and lowers a breakdown voltage of the LDMOS transistor.

20 Claims, 10 Drawing Sheets

EMBEDDED CLAMPING DIODE TO IMPROVE DEVICE RUGGEDNESS

BACKGROUND

High voltage integrated circuits (HVICs) are widely used in, among other things, switching power supplies, motor drivers, and other power control systems. An HVIC may include, for example, a low voltage device, a high voltage device, and a level shifter on a common semiconductor chip. There has been a long felt need to make these devices smaller and more rugged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
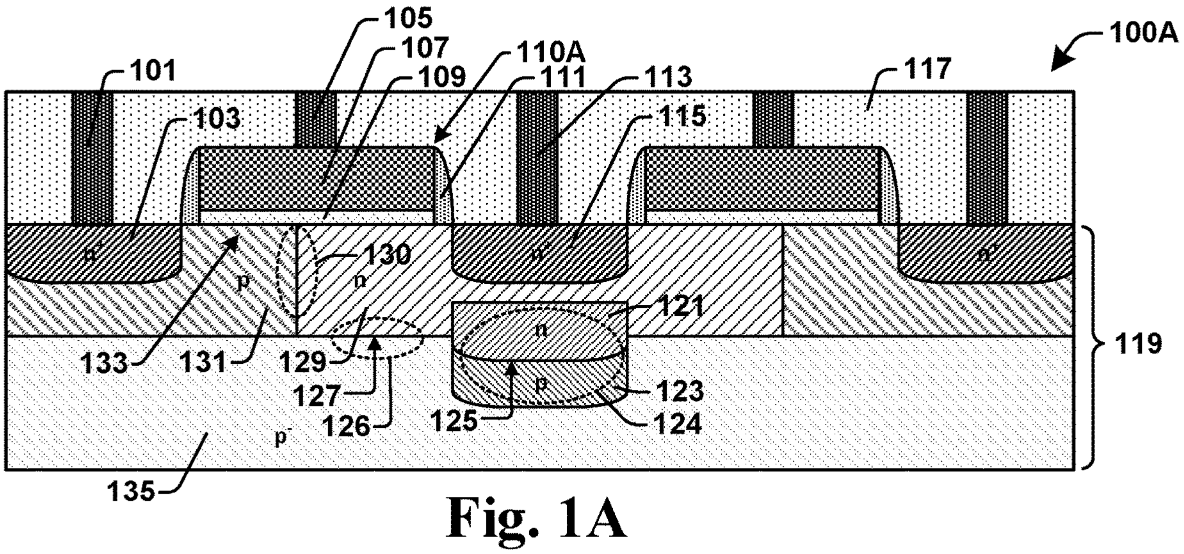
FIG. 1A illustrates a cross-sectional side view of an integrated circuit (IC) device according to some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Parasitic inductance may cause voltage overshoot in a power switching circuit operating at high switching speeds. Voltage overshoot may lead to impact ionization and cause device degradation that manifests as a reduction in drain current. The present disclosure provides a device and method in which this type of degradation is reduced or avoided by embedding a diode directly under the drain of the device. The embedded diode has heavier doping than a drift region of the device and lowers a breakdown voltage of the device.

Some aspects of the present disclosure relate to an integrated circuit device that includes a transistor comprising a channel provided by a semiconductor substrate, a gate electrode above the channel, a gate dielectric between the gate electrode and the channel, a source region, and a drain region. A drift region directly beneath the gate electrode extends from the channel to the drain. An embedded diode is provided by a first deep well directly beneath the drain and a second deep well of opposite doping type directly beneath the first deep well. The first deep well has the same doping type as the drift region but a higher dopant concentration. Source/drain region(s) may refer to a source or a drain, individually or collectively depending upon the context.

In some embodiments the semiconductor substrate has the opposite doping type in a region immediately beneath the drift region and directly under the gate electrode so that a vertical PN diode is formed directly under the gate electrode. The vertical PN diode has lighter doping than the embedded diode. Both the P-type and N-type regions of the embedded diode have heavier doping than the P-type and N-type regions of the vertical PN diode. In some embodiments, the dopant concentrations in the vertical PN diode are at least about an order of magnitude lower.

In some embodiments, the transistor is a high voltage device. In some embodiments, the transistor has a threshold voltage in a range from about 5 volts to about 35 volts. In some embodiments, the transistor is a laterally diffused metal oxide semiconductor device (LDMOS). In some embodiments, the transistor is an n-channel device. In some embodiments, the transistor has a variable gate oxide thickness so that the gate oxide is thicker on the drain side. The embedded diode is operative as a clamping diode for the transistor.

In some embodiments, the deep p-well and the deep n-well that form the embedded diode are doped with the same alignment as the drain. For example, the drain may be doped in alignment with a spacer on the side of the gate electrode and the deep p-well and the deep n-well may also be doped in alignment with that spacer. In some embodiments, the drain is aligned to an isolation structure. The isolation structure may be a field oxide structure produced by local oxidation of silicon (LOCOS), a shallow trench isolation (STI) structure, or the like. In some embodiments, the isolation structure extends underneath the gate electrode. Having the embedded diode directly under the drain but not directly underneath the gate electrode reduces the possibility of gate oxide damage when junction breakdown occurs.

In some embodiments, the first deep well of the embedded diode is sufficiently deep so that the drift region extends between the drain and the embedded diode. The advantages of disposing the embedded diode more deeply in the semiconductor substrate may include preventing the first deep well from lowering a threshold voltage of the transistor. In some embodiments, the doping of the deep p-well and the deep n-well that form the embedded diode eliminates the drift region directly underneath the drain. The latter configuration may improve the protection provided by the embedded diode.

In some embodiments, the PN junction of the embedded diode is as shallow or shallower than a bottom of the drift region. It may be easier to form the embedded diode in a comparatively shallow position. In some embodiments, the PN junction of the embedded diode is deeper in the semiconductor substrate than the bottom of the drift region. Disposing the PN junction of the embedded diode deeper in the semiconductor substrate may help protect the gate dielectric when junction breakdown occurs.

In some embodiments, the transistor is part of a multi-finger device. The number and/or length of the fingers may be selected to provide a desired current rating for the multi-finger device. In some embodiments, the drain and the embedded diode are disposed between two adjacent fingers of the multi-finger device. The multi-finger device may be surrounded by an isolation structure such as a guard ring. The multi-finger device may be further isolated by a buried layer directly beneath the multi-finger device.

In some embodiments, a body contact region is formed in the semiconductor substrate adjacent the source region. In some embodiments, a source for the transistor is connected to the body contact region. In some embodiments, the source is connected to both the source region and the body contact region. A terminal of the embedded diode may be coupled to the body contact region through the semiconductor substrate.

FIG. 1A illustrates a cross-sectional view of an integrated circuit (IC) device 100A that includes a transistor 110A according to some embodiments. The transistor 110A has a source region 103, a channel region 133, a drift region 129, and a drain region 115 that are formed in a semiconductor substrate 119. The channel region 133 is provided by a p-doped region 131 of the semiconductor substrate 119. The drift region 129, the source region 103, and the drain region 115 have n-type doping. The transistor 110A further includes a gate electrode 107 and a gate dielectric 109 that separates the gate electrode 107 from the semiconductor substrate 119. The gate electrode 107 is disposed directly over a junction 130 between the channel region 133 and the drift region 129. The source region 103 and the drain region 115 may be aligned to spacers 111 disposed on the sides of the gate electrode 107.

An embedded diode 124 is disposed directly beneath the drain region 115. The embedded diode 124 is provided by a deep n-well 121 and a deep p-well 123. The deep n-well 121 and the deep p-well 123 have border locations in a pattern of the type that results from forming them by implanting dopants in alignment with the spacers 111. In the illustrated examples the sidewalls are substantially vertical and in horizontal alignment with the spacers 111.

In some embodiments, the deep n-well 121 has a dopant concentration in the range from about $1\times10^{17}$ atoms/cm$^3$ to about $1\times10^{19}$ atoms/cm$^3$. The deep n-well 121 has a higher dopant concentration than the drift region 129. In some embodiments, the deep n-well 121 has a dopant concentration about ten times or more greater than the dopant concentration in the drift region 129. The drain region 115 has a higher dopant concentration that the deep n-well 121. In some embodiments, the drain region 115 has a dopant concentration about ten times or more greater than the deep n-well 121. In some embodiments, the dopant concentration of the semiconductor substrate 119 goes through a minimum between the drain region 115 and the deep n-well 121. In some embodiments, the drift region 129 extends between the drain region 115 and the deep n-well 121.

In some embodiments, the deep p-well 123 has a dopant concentration in the range from about $1\times10^{17}$ atoms/cm$^3$ to about $1\times10^{19}$ atoms/cm$^3$. In some embodiments, the deep p-well 123 has a dopant concentration on the same order of magnitude as the deep n-well 121. In some embodiments, the deep p-well 123 has a higher dopant concentration than the drift region 129. In some embodiments, the deep p-well 123 has a dopant concentration about ten times or more greater than the dopant concentration in the drift region 129. The semiconductor substrate 119 has a bulk region 135 that has p-type doping and is directly below the drift region 129 and the gate electrode 107. In some embodiments, the deep p-well 123 has a dopant concentration about ten times or more greater than the dopant concentration in the p-doped region 131.

The drift region 129 and the bulk region 135 form a vertical PN diode 126 having a vertical PN junction 127 directly beneath the gate electrode 107. The deep n-well 121 and the deep p-well 123 form the embedded diode 124 having an embedded PN junction 125 directly beneath the drain region 115. In some embodiments, the vertical PN junction 127 does not extend directly beneath the drain region 115 because the deep n-well 121 and the deep p-well 123 occupy the space that is lateral to the vertical PN junction 127 and directly beneath the drain region 115. In some embodiments, the embedded PN junction 125 does not extend directly beneath the gate electrode 107 because the deep n-well 121 and the deep p-well 123 do not extend that far laterally. In the transistor 110A, the embedded PN junction 125 is lower the and vertical PN junction 127.

In some embodiments, the deep n-well 121 is laterally displaced from the gate electrode 107 so that the deep n-well 121 does not extend directly underneath the gate electrode 107. In some embodiments, the deep p-well 123 is laterally displaced from the gate electrode 107 so that the deep p-well 123 does not extend directly underneath the gate electrode 107.

Figure 1B:
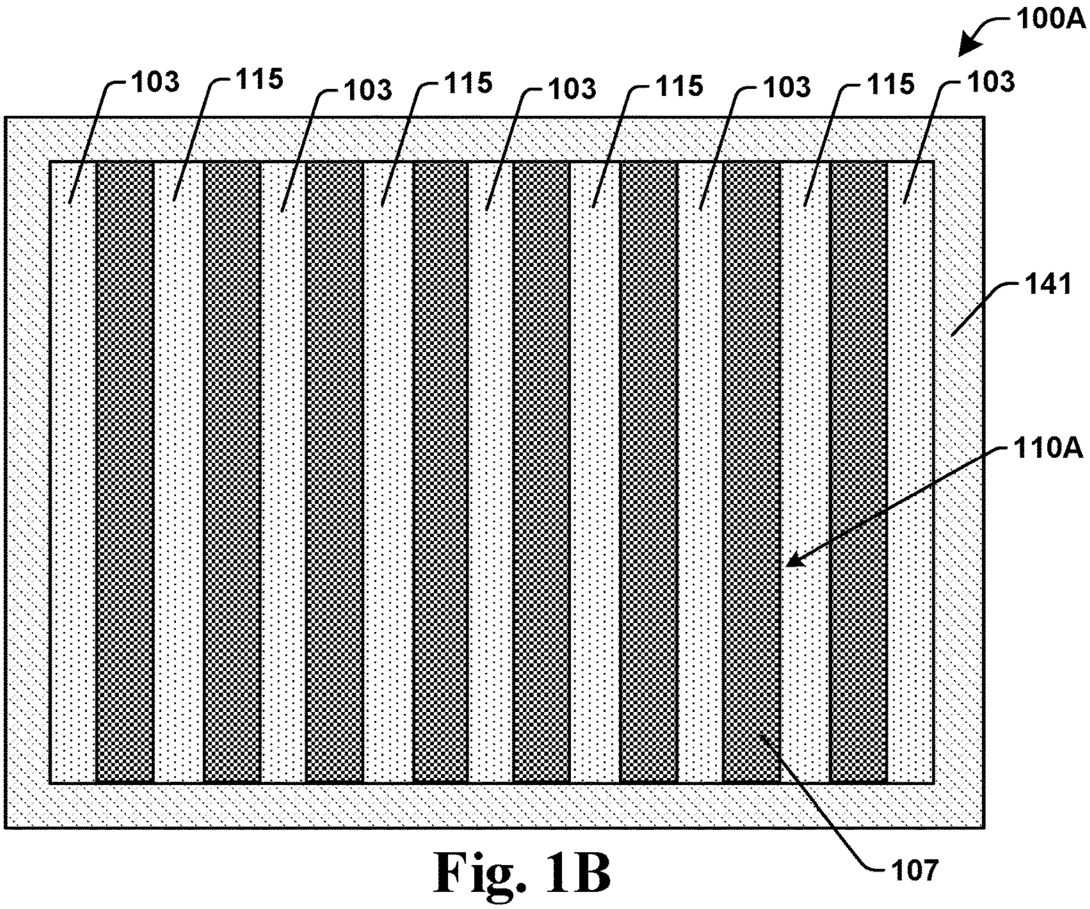
FIG. 1B illustrates a plan view of the IC device of FIG. 1A.

FIG. 1B illustrates a plan view of a portion of the IC device 100A. As shown in FIG. 1B, the gate electrodes 107 may be elongated to form strips. A plurality of these strips may be laid out and connected in parallel to form a device having multiple fingers. The drain regions 115 are disposed between adjacent pairs of gate electrodes 107. Providing the IC device 100A with multiple fingers allows the current carrying capacity of the IC device 100A to be increased while preserving the channel length and preventing the device from being excessively elongated. The transistor 110A may be surrounded by an isolation structure 141. In some embodiments, the isolation structure 141 comprises a shallow trench isolation structure. In some embodiments, the isolation structure 141 comprises a guard ring.

Figure 2:
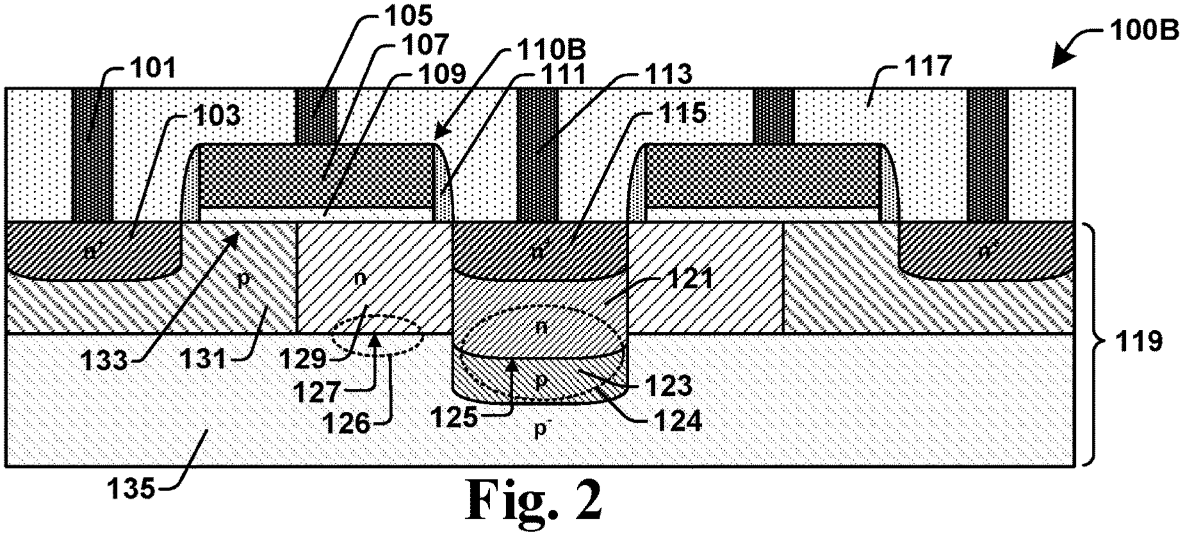
FIGS. 2-9 illustrate cross-sectional side views of IC devices according to various other embodiments.

FIG. 2 illustrates a cross-sectional view of an IC device 100B that includes a transistor 110B according to some other embodiments. The transistor 110B is like the transistor 110A of FIG. 1 except that in the transistor 110B the drift region 129 does not extend between the deep n-well 121 and the drain region 115. Instead, the deep n-well 121 abuts the drain region 115.

Figure 3:
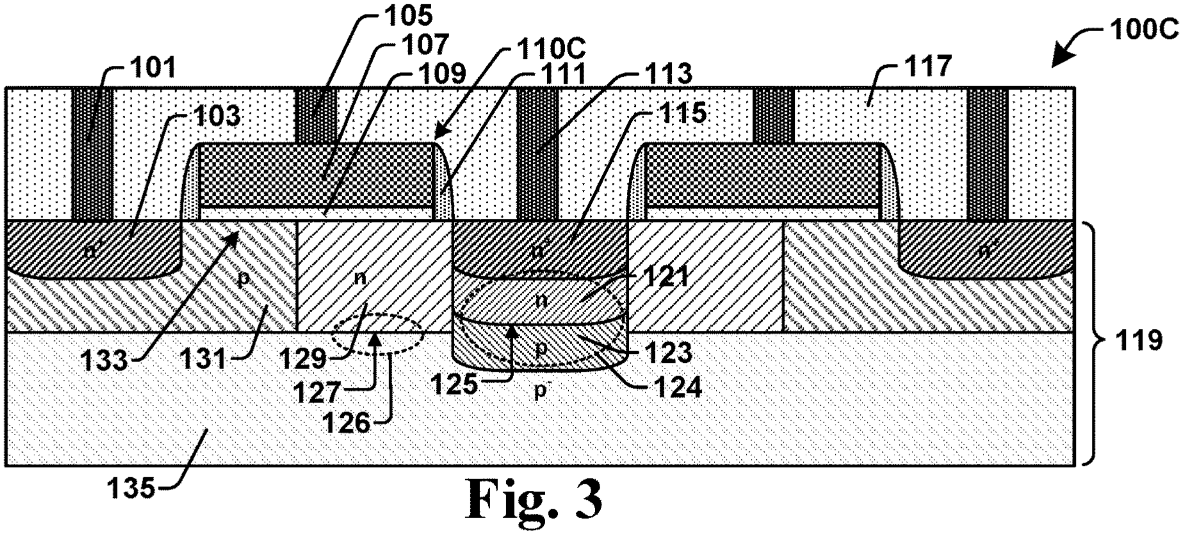

FIG. 3 illustrates a cross-sectional view of an IC device 100C that includes a transistor 110C according to some other embodiments. The transistor 110C is like the transistor 110B of FIG. 2 except that in the transistor 110B the embedded PN junction 125 is at or above the vertical PN junction 127. In some embodiments, the embedded PN junction 125 is above the vertical PN junction 127.

Figure 4:
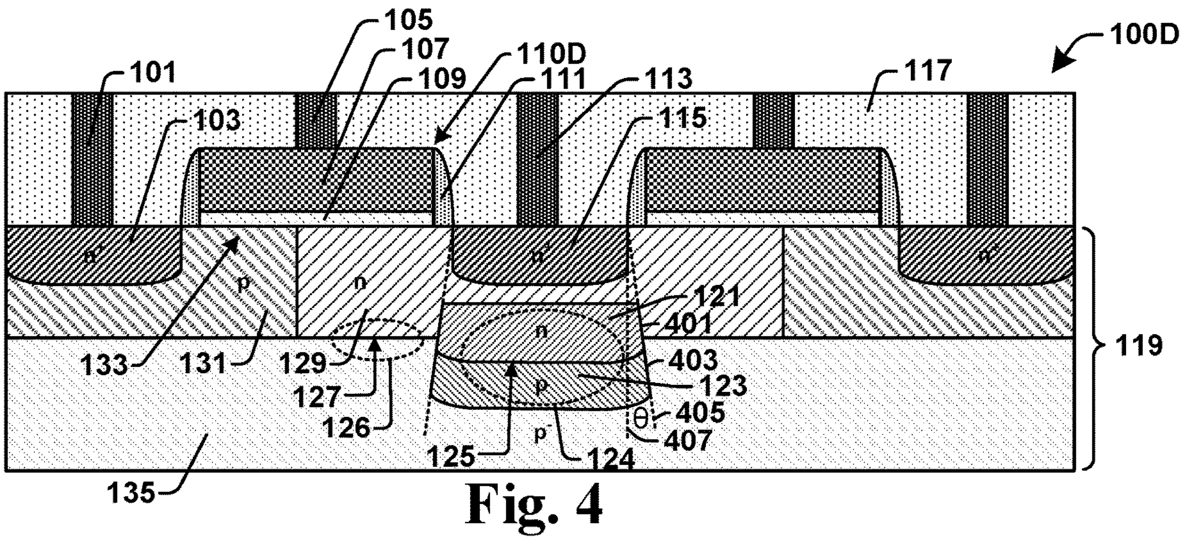

FIG. 4 illustrates a cross-sectional view of an IC device 100D that includes a transistor 110D according to some other embodiments. The transistor 110D is like the transistor 110A of FIG. 1 except that in the transistor 110D a sidewall 401 of the deep n-well 121 forms an angle θ with a vertical plane 407 that is horizontally aligned to the spacers 111. A sidewall 403 of the deep p-well 123 may also form the angle θ with the vertical plane 407. The sidewall 401 lies in a plane 405 that meets the edge of the spacer 111. These are geometric features that result from forming the deep n-well 121 by implanting dopants ions in alignment with the spacer 111. The drain region 115 may also have a geometry that result from doping in alignment with the spacer 111 but may have a different sidewall angle. The angle θ depends on the conditions used during the ion implantation process.

Figure 5:
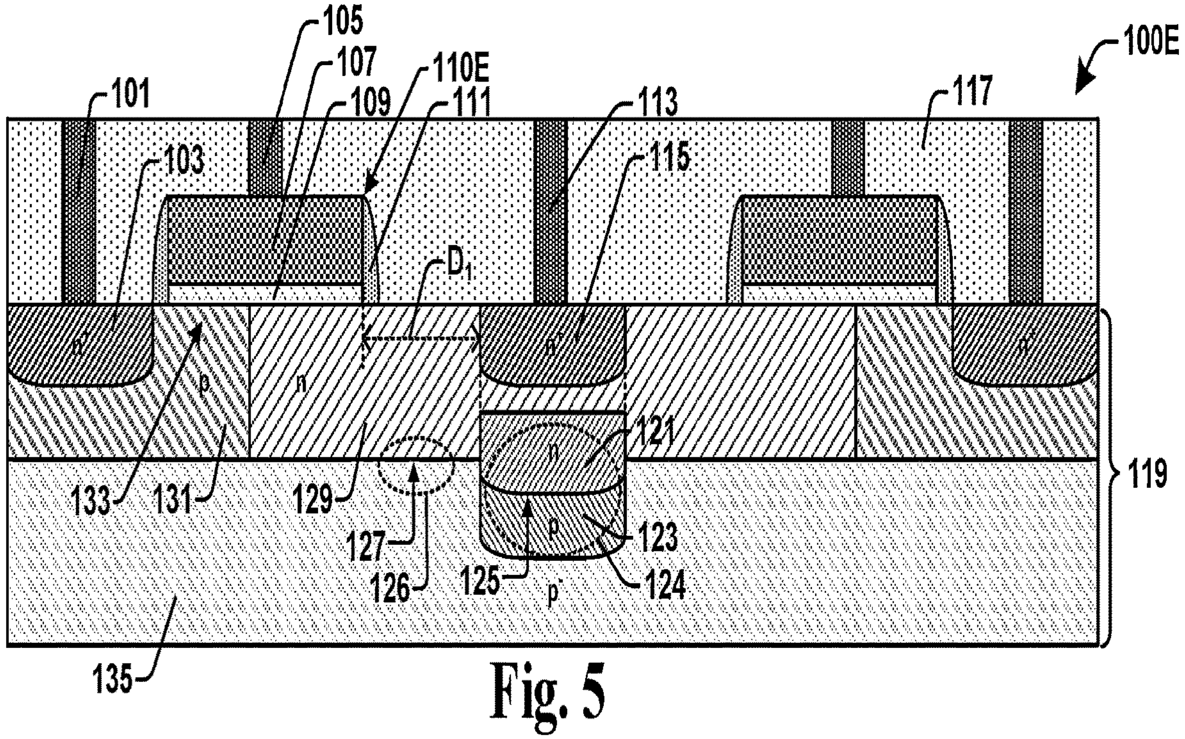

FIG. 5 illustrates a cross-sectional view of an IC device 100E that includes a transistor 110E according to some other embodiments. The transistor 110E is like the transistor 110A of FIG. 1 except that in the transistor 110E the drain regions 115 are laterally displaced from the spacers 111. The drain regions 115 may be laterally displaced a distance $D_1$ from gate electrodes 107. The distance $D_1$ is greater than a width of the spacers 111. In some embodiments, the distance $D_1$ is in the range from about 100 nm to about 2 μm. In some embodiments of the transistor 110E, the deep n-well 121, and the deep p-well 123 are aligned to the drain region 115. That alignment may be achieved by doping the drain region 115 with a mask that is also used for doping the deep n-well 121 and the deep p-well 123.

Figure 6:
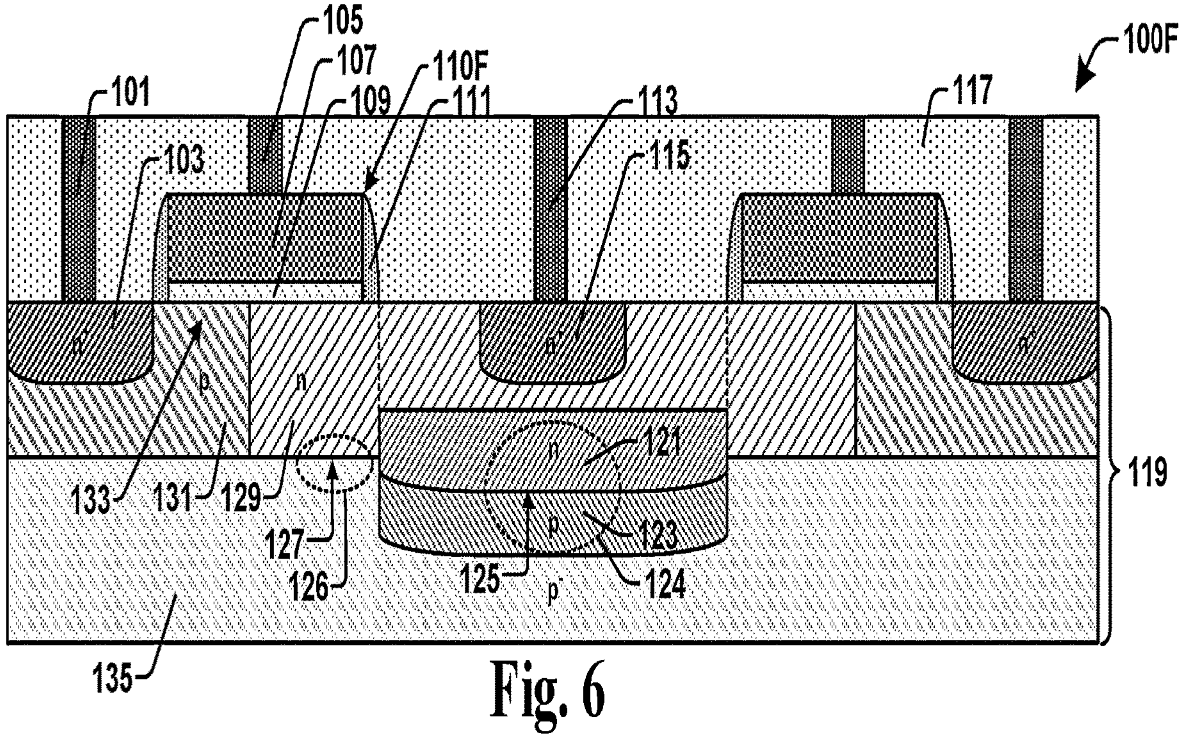

FIG. 6 illustrates a cross-sectional view of an IC device 100F that includes a transistor 110F according to some other embodiments. The transistor 110F is like the transistor 110E of FIG. 5 except that in the transistor 110F the deep n-well 121 and the deep p-well 123 are aligned to the spacers 111 rather than to the drain region 115.

Figure 7:
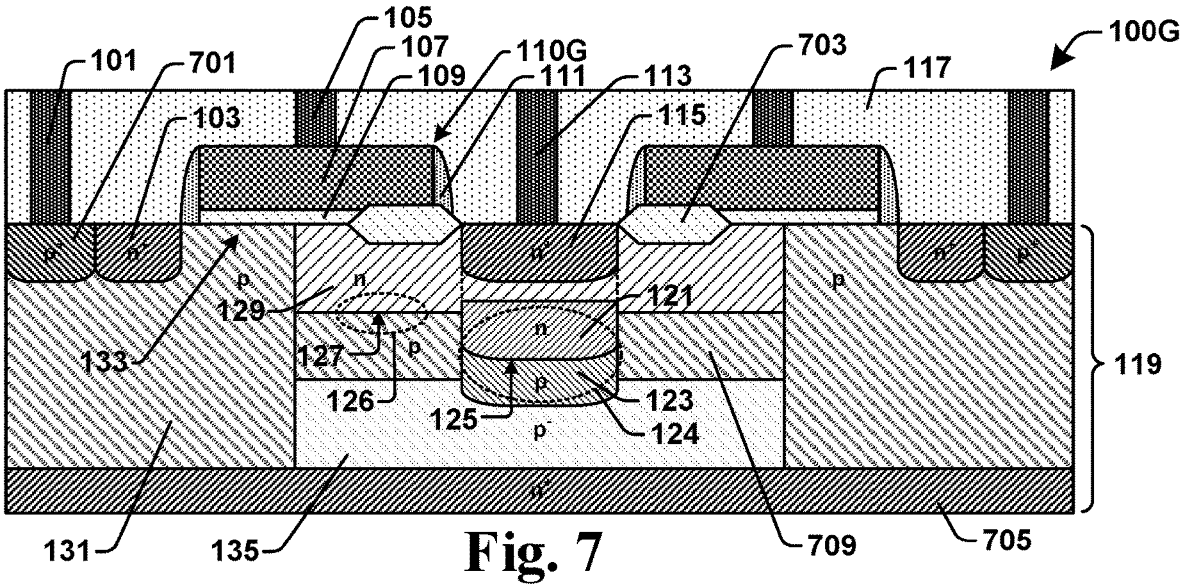

FIG. 7 illustrates a cross-sectional view of an IC device 100G that includes a transistor 110G according to some other embodiments. The transistor 110G is like the transistor 110A of FIG. 1 in many respects, but in the transistor 110G the drain region 115, the deep n-well 121, and the deep p-well 123 are aligned to a field oxide structure 703 that is under one side of the gate electrode 107. The field oxide structure 703 may be provided to increase a threshold voltage of the transistor 110G. The IC device 100G illustrates additional structures that are options with other embodiments. One of those options is that the semiconductor substrate 119 includes a buried n-layer 705 and the portion of the semiconductor substrate 119 that is above the buried n-layer 705 is formed by epitaxial growth. Another option is to include a p-well 709 directly beneath the drift region 129 in the area directly below the gate electrode 107. The p-well 709 has heavier doping than the bulk region 135 and like the drift region 129 has a dopant concentration in the range from about $10^{16}/cm^3$ to about $10^{18}/cm^3$. Another option is to include body contact regions 701 that are butted to the source regions 103. The body contact regions 701 have p-type doping. Source contact plugs 101 may be coupled to the body contact regions 701 rather than coupling directly to the source regions 103. A p-terminal of the embedded diode 124 is coupled to the body contact region 701 through the p-doped region 131 and the bulk region 135.

Figure 8:
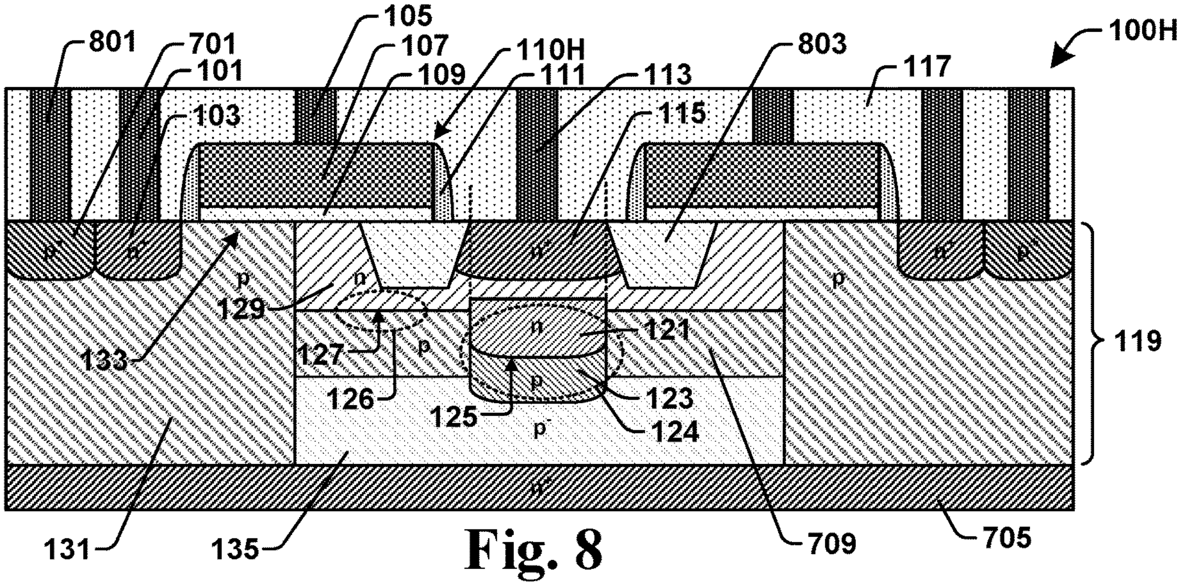

FIG. 8 illustrates a cross-sectional view of an IC device 100H that includes a transistor 110H according to some other embodiments. The transistor 110H is like the transistor 110G of FIG. 7 in most respects, but in the transistor 110H the drain region 115, deep n-well 121, and the deep p-well 123 are aligned to a shallow trench isolation (STI) structure 803 that is under one side of the gate electrode 107. Another difference is that in the transistor 110H the source contact plugs 101 couple directly with the source regions 103. Body contact plugs 801 connect with the body contact regions 701. The source contact plugs 101 and the body contact plugs 801 may be connected to the same source or to different voltage sources.

Figure 9:
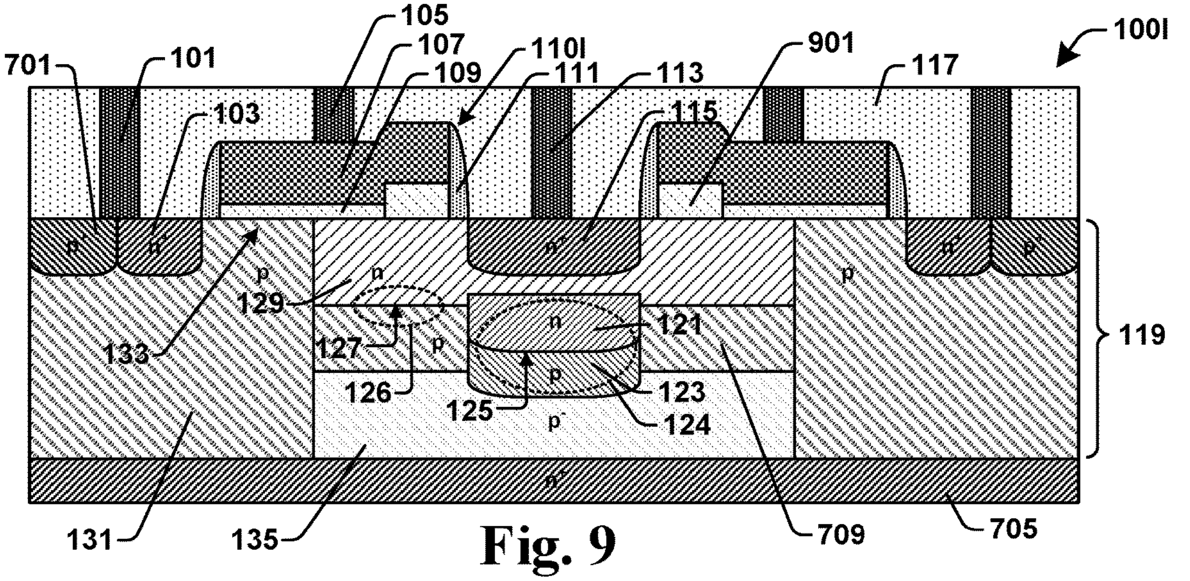

FIG. 9 illustrates a cross-sectional view of an IC device 100I that includes a transistor 110I according to some other embodiments. The transistor 110I is like the transistor 110G of FIG. 7 in most respects, but in the transistor 110H the drain region 115, deep n-well 121, and the deep p-well 123 are aligned to the spacer 111. In the transistor 110I, a supplemental oxide 901 deposited on the drain side makes the gate dielectric 109 thicker on the drain side. The spacers 111 on the drain side may abut the supplemental oxide 901. In the transistor 110I the source contact plugs 101 directly contact both the body contact regions 701 and the source regions 103.

Various features of the IC devices 100A-I of FIGS. 1-9 may be combined with one another to form additional embodiments in accordance with the present disclosure. All of these examples show n-channel devices. It will be appreciated that the doping types in these examples may be reversed to form p-channel devices in accordance with the present disclosure.

FIGS. 10 through 15 are cross-sectional view illustrations exemplifying a method according to the present disclosure of forming an IC device. While FIGS. 10 through 15 are described with reference to various embodiments of a method, it will be appreciated that the structures shown in FIGS. 10 through 15 are not limited to the method but rather may stand alone separate from the method. FIGS. 10 through 15 are described as a series of acts. The order of these acts may be altered in other embodiments. While FIGS. 10 through 15 illustrate and describe a specific set of acts, some may be omitted in other embodiments. Further, acts that are not illustrated and/or described may be included in other embodiments. While the method of FIGS. 10 through 15 illustrates the formation of the IC device 100A of FIG. 1A, it will be appreciated that the method may be varied to form IC devices according to other embodiments of this disclosure.

Figure 10:
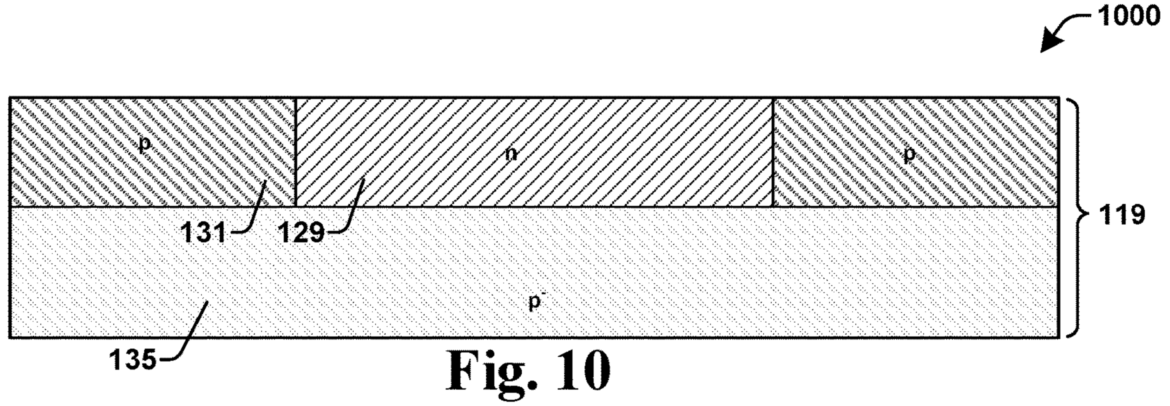
FIGS. 10-15 are a series of cross-sectional view illustrations exemplifying a method according to some embodiments of forming an IC device such as the IC device of FIG. 1A.

As shown by the cross-sectional view 1000 of FIG. 10, the method may begin with provision of the semiconductor substrate 119 and doping as needed to provide the drift region 129 and the p-doped region 131. The semiconductor substrate 119 may be, for example, a bulk substrate (e.g., a bulk silicon substrate), a silicon-on-insulator (SOI) substrate, or the like. The semiconductor may be silicon (Si), a group III-V or some other binary semiconductor, a tertiary semiconductor (e.g., AlGaAs), a higher order semiconductor, or the like. The upper portion of the semiconductor substrate 119 including the bulk region 135 may be a single crystal structure, an epitaxially grown structure, or the like. In some embodiment, the bulk region 135 is the main body of the semiconductor substrate 119. In some embodiment, the bulk region 135 has a dopant concentration in the range from about $10^{12}/cm^3$ to about $10^{15}/cm^3$.

In some embodiments, the p-doped region 131 has P-type doping with a dopant concentration in the range from about $10^{16}/cm^3$ to about $10^{18}/cm^3$. In some embodiments, the p-doped region 131 has P-type doping with a dopant concentration of about $10^{17}/cm^3$, e.g., the range from about $5\times10^{16}/cm^3$ to about $4\times10^{17}/cm^3$. In some embodiments, the p-doped region 131 is provided by masking followed by implantation of P-type dopant ions. In some embodiments, the p-doped region 131 is provided by and integral with the bulk region 135, in which case the bulk region 135 is more heavily doped to provide a suitable dopant concentration for the channel region 133 (see FIG. 1). In some embodiments the p-doped region 131 is formed by a lateral diffusion process carried out subsequent to the formation of the gate electrodes 107 (see FIG. 1). The lateral diffusion process includes implanting P-type dopants on the source sides of the gate electrodes 107 followed by heat treatment that causes the dopants to diffuse.

In some embodiments, the drift region 129 has N-type doping with a dopant concentration in the range from about $10^{16}/cm^3$ to about $10^{18}/cm^3$. In some embodiments, the drift region 129 has N-type doping with a dopant concentration of about $10^{17}/cm^3$, e.g., the range from about $5\times10^{16}/cm^3$ to about $4\times10^{17}/cm^3$. In some embodiments, the drift region 129 is provided by masking followed by implantation of P-type dopant ions. In some embodiments the drift region 129 is formed by a lateral diffusion process carried out subsequent to the formation of the gate electrodes 107 (see FIG. 1). The lateral diffusion process includes implanting N-type dopants on the drain sides of the gate electrodes 107 followed by heat treatment that causes the dopants to diffuse.

Figure 11:
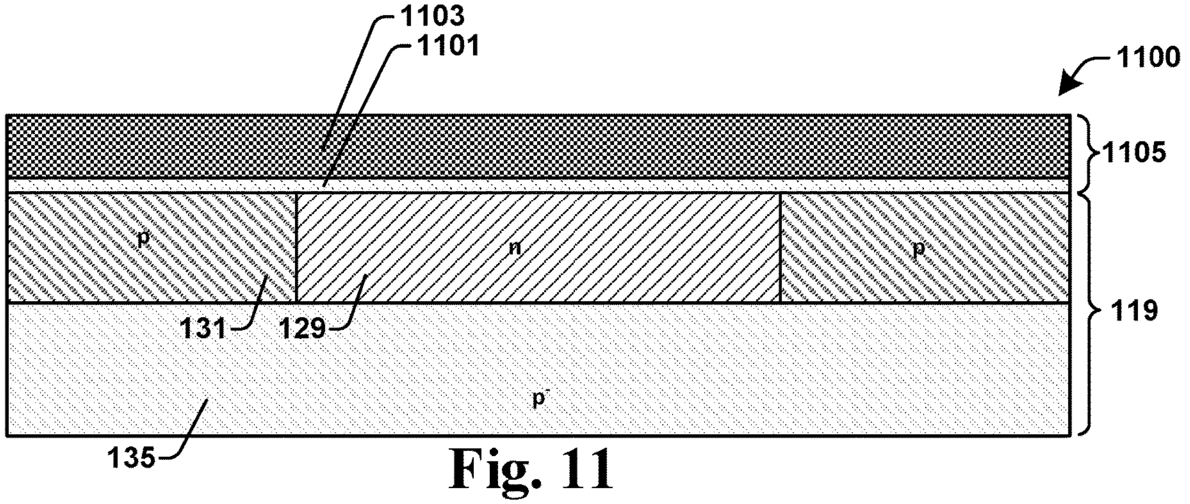

As shown by the cross-sectional view 1100 of FIG. 11, the process may continue with formation of a gate stack 1105 over the semiconductor substrate 119. The gate stack 1105 includes a gate dielectric layer 1101 and a gate electrode layer 1103. In some embodiments, formation of the gate dielectric layer 1101 includes oxidizing an upper surface of the semiconductor substrate 119. In some embodiments, formation of the gate dielectric layer 1101 includes depositing one or more dielectric layers. The deposition process may be physical vapor deposition (PVD), chemical vapor deposition (CVD), atomic layer deposition (ALD), the like, or some other suitable process. The gate dielectric layer may comprise one or more layers of dielectric materials. The dielectric materials may be or comprise silicon dioxide ($SiO_2$), a high-K dielectric, the like, or some other suitable dielectric(s). In some embodiments, the gate dielectric layer 1101 is or comprises silicon dioxide ($SiO_2$) or the like. The gate electrode layer 1103 may be deposited by PVD, CVD, ALD, the like, or some other suitable process. The gate electrode layer 1103 may be or comprise a conductive material such as a metal, polysilicon, graphene, or the like. In some embodiments, the gate electrode layer 1103 is polysilicon or the like.

Additional processing may be performed during or prior to the formation of the gate stack 1105 to produce devices in accordance with various embodiments of the present disclosure. For example, masking and oxidation processes may be carried out to produce the field oxide structures 703 of FIG. 7; masking, etching, deposition, and planarization processes may be carried out to form the STI structures 803 of FIG. 8; or a deposition and etching process may be carried out to form the supplemental oxide 901 of FIG. 9.

Figure 12:
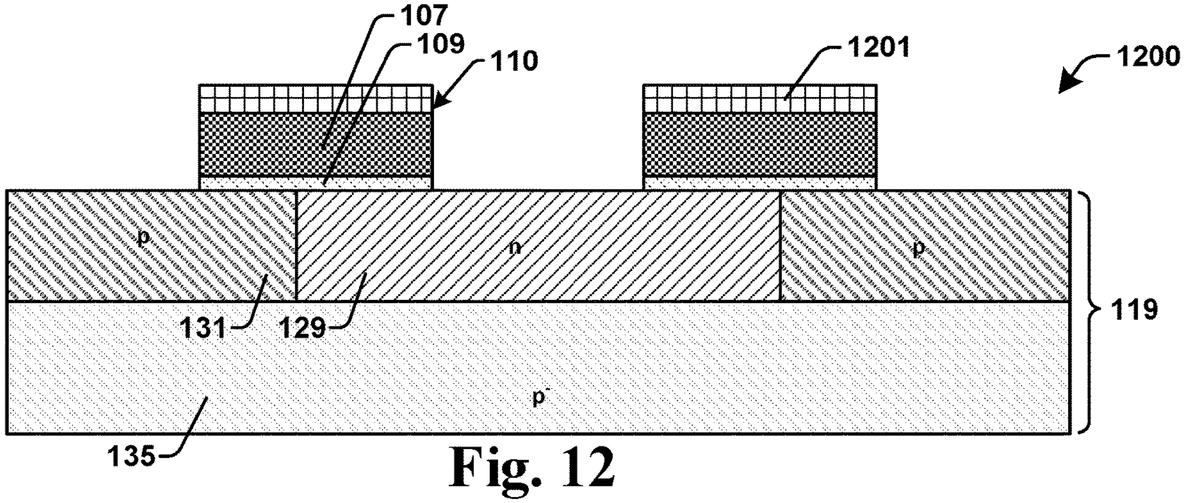

As shown by the cross-sectional view 1200 of FIG. 12, the process may continue with forming a mask 1201 and etching to pattern the transistors 110 from the gate stack 1105. The mask 1201 may be patterned by photolithography or the like. The patterning process may comprise plasma etching or the like. Patterning produces the gate dielectrics 109 from the gate dielectric layer 1101 and the gate electrodes 107 from gate electrode layer 1103.

Figure 13:
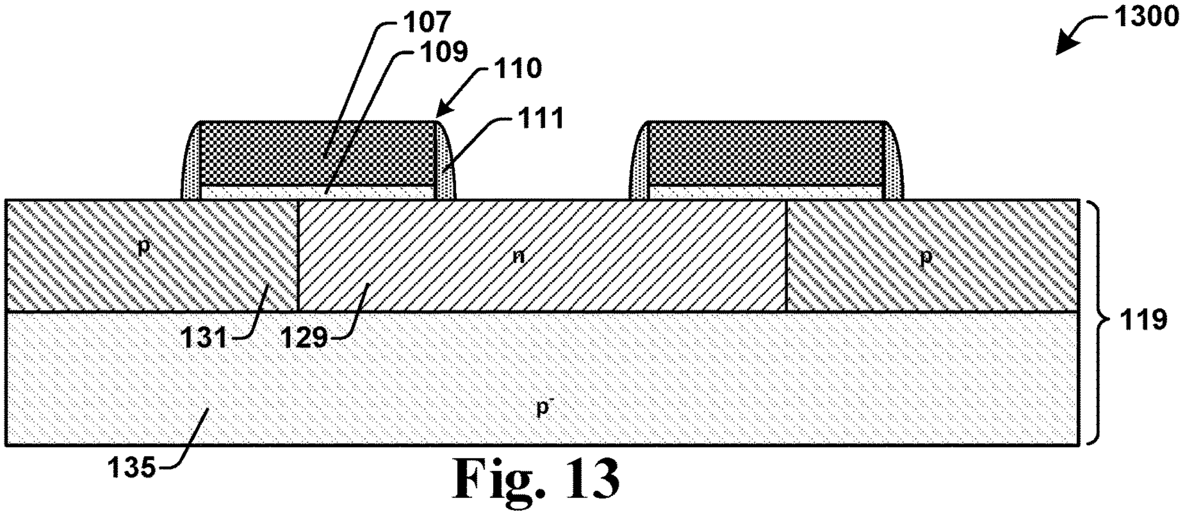

As shown by the cross-sectional view 1300 of FIG. 13, spacers 111 may be formed on the sidewalls of the transistors 110. Forming the spacers 111 may comprise depositing a spacer material and then anisotropic plasma etching to leave only the thicker material on the sidewalls. The deposition process may be PVD, CVD, ALD, the like, or any other suitable process. The spacer material may include one or more layers of dielectric oxides, nitrides, carbides, combinations thereof, or the like. In some embodiments, the spacer material comprises silicon nitride (SiN) or the like.

Figure 14:
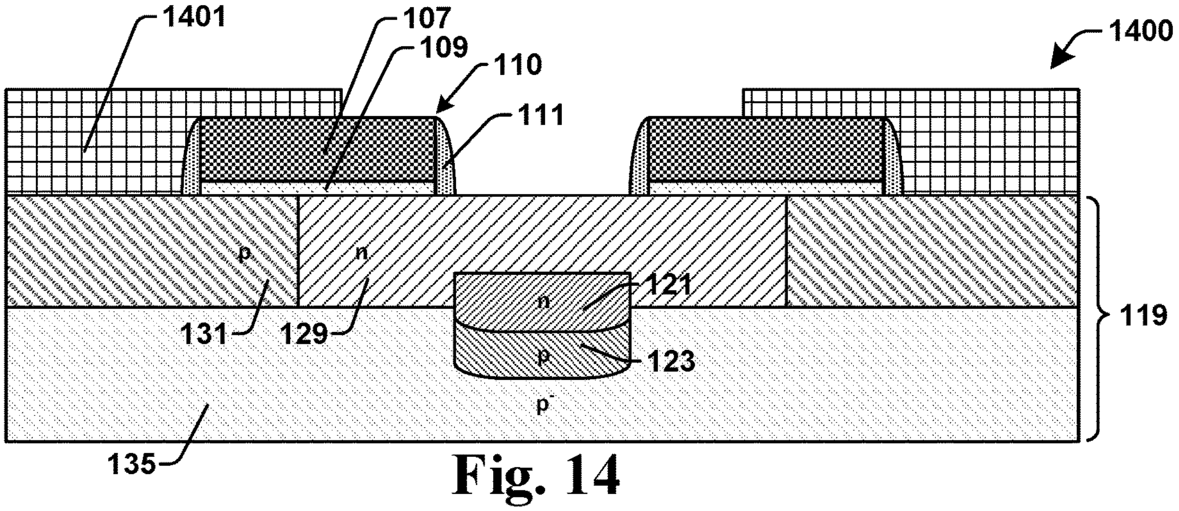

As shown by the cross-sectional view 1400 of FIG. 14, a mask 1401 may be formed and ion implantation processes may be carried out to successively form the deep p-well 123 and the deep n-well 121. The mask 1401 covers the semiconductor substrate 119 on the source sides of the transistors 110 while the ion implantations are taking place. In accordance with some embodiments, one or both ion implantation processes are self-aligned to the spacers 111 on the drain sides of the transistors 110. In some embodiments, one or both of the doping processes that form the deep p-well 123 and the deep n-well 121 are self-aligned to the gate electrodes 107 on the drain sides of the transistors 110. In some embodiments, one or both doping processes are self-aligned to field oxide structures 703 (see FIG. 7) on the drain sides of the transistors 110. In some embodiments, one or both doping processes are self-aligned to STI structures 803 (see FIG. 8) on the drain sides of the transistors 110. In some embodiments, the mask 1401 extends onto the drain sides of the transistors 110 so that one or both of the deep p-well 123 and the deep n-well 121 are laterally displaced from the transistors 110 (see FIG. 5).

In some embodiments, the dopants that form the deep p-well 123 and the dopants that form the deep n-well 121 are each implanted by an ion implantation process with a dosage in the range from about $10^{13}/cm^2$ to about $10^{17}/cm^2$. In some embodiments, the dosages are in the range from about $10^{13}/cm^2$ to about $10^{16}/cm^2$. The energy levels of the implantation processes may be adjusted to achieve desired doping depths. In some embodiments, the dopants for the deep n-well 121 are deposited with greater energy than the dopants that form the drift region 129. In some embodiments, the dopants for the deep p-well 123 are deposited with greater energy than the dopants that form the drift region 129. In some embodiments, the dopants for the deep p-well 123 are deposited with greater energy than the dopants for the deep n-well 121. The degrees to which the dopant implantations processes are made anisotropic may be controlled to vary the angle θ (see FIG. 4) by which the deep p-well 123 and the deep n-well 121 are aligned to the spacers 111.

Figure 15:
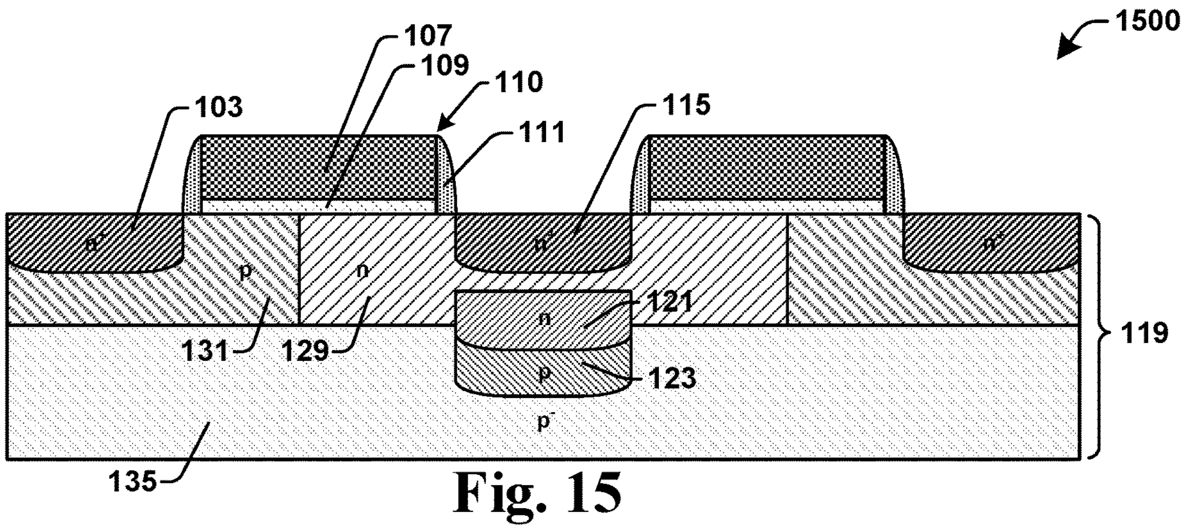

As shown by the cross-sectional view 1500 of FIG. 15, another ion implantation process may be carried out to form the source regions 103 and the drain regions 115. The ion implantation process may provide N-type doping and may have a lower energy than the ion implantations used to form the deep p-well 123 and the deep n-well 121 so that the source regions 103 and the drain regions 115 are shallower. In some embodiments, the dopants are deposited to concentrations in the range from about $10^{19}/cm^3$ to about $10^{21}/cm^3$. In some embodiments, the drain regions 115 are self-aligned to a same structure to which the deep p-well 123 and the deep n-well 121 are self-aligned, e.g., self-aligned to the spacers 111. Masking and p-type dopant implantation may also be carried out at this stage of processing to form P-doped contact regions such as the body contact regions 701 (see FIG. 7).

Further processing provides an interlevel dielectric 117, the source contact plugs 101. the gate contacts 105, and the drain contact 113 as shown in FIG. 1A. The interlevel dielectric 117 may be silicon oxide (SiO), a low-K dielectric, the like, of any other suitable dielectric. The interlevel dielectric 117 may be formed by CVD, PVD, the like, or any other suitable process. A mask may be formed and used to etch holes through the interlevel dielectric 117. Metal may be deposited to fill the holes and thereby form the source contact plugs 101, the gate contacts 105, and the drain contact 113. Excess metal may be removed by a planarization process such as chemical mechanical polishing (CMP). The metal may be, for example, aluminum, copper, titanium, tantalum, titanium nitride, tantalum nitride, ruthenium, tungsten, another conductive material, the like, or any combination of the foregoing. The examples of FIGS. 10 through 15 describe the formation of n-channel devices. The doping types in these examples may be reversed to form p-channel devices.

Figure 16:
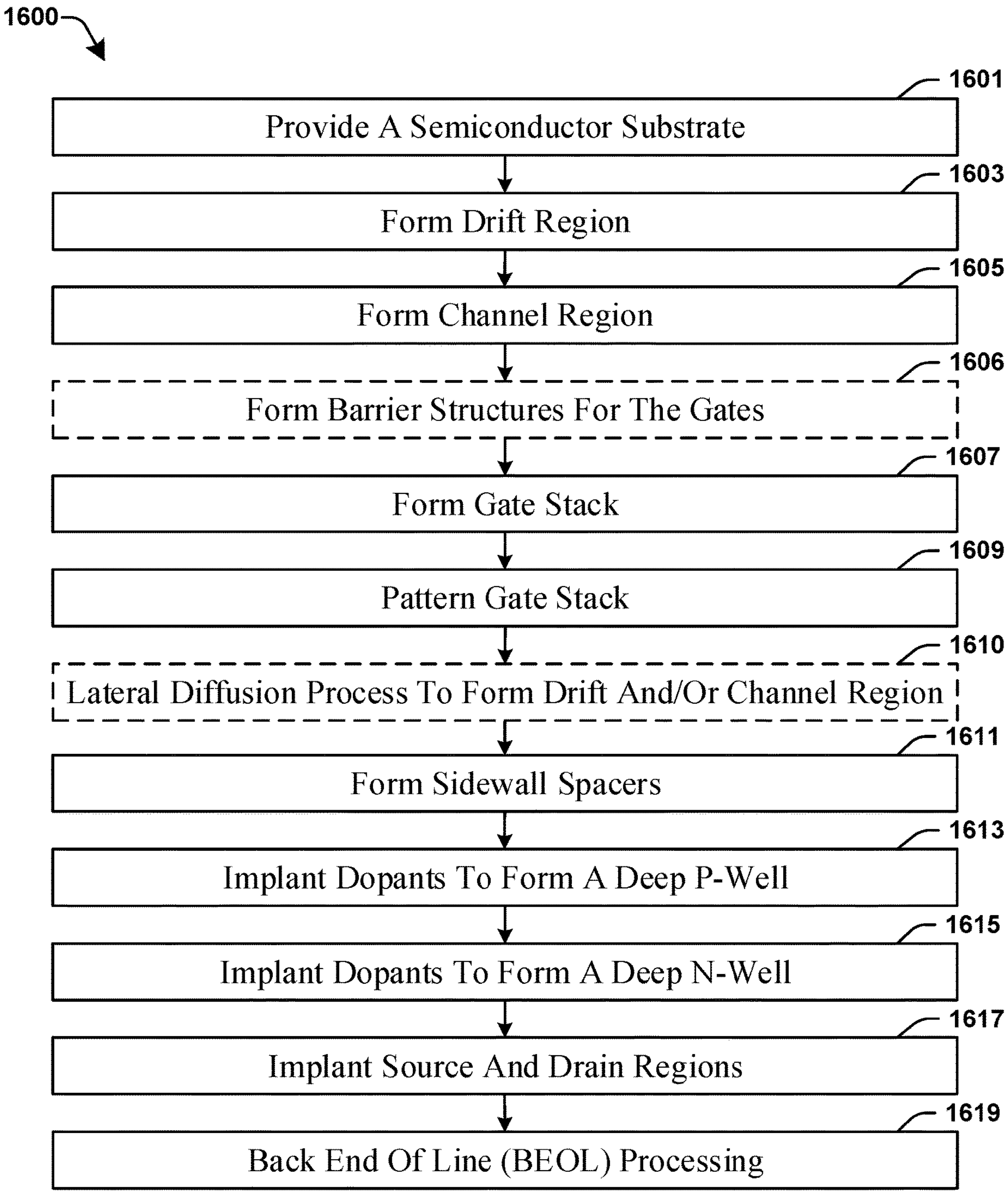
FIG. 16 provides a flow chart illustrating a method of forming an IC device according to some embodiments.

FIG. 16 presents a flow chart for a process 1600 according to the present disclosure that may be used to form an IC device. While the process 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases. The process 1600 includes steps for forming the integrated circuit device 100A of FIG. 1A. Variation of the process 1600 may be used to form other integrated circuit devices of the present disclosure.

The process 1600 may begin with act 1601, providing a semiconductor substrate, act 1603, forming a well of a first doping type to provide a drift region, and act 1605, forming a well of a second doping type to provide a channel. The cross-sectional view 1000 of FIG. 10 provides an example. In some embodiments, the semiconductor substrate includes a buried layer of the first doping type. The buried n-layer 705 of FIG. 7 provides an example of this type of layer. An epitaxial layer of the second doping type may be grown over the buried layer. Optionally, act 1603 and/or act 1605 is omitted and formation of the well of the first doing type and/or formation of the well of the second doping type provided by act 1610, which is a lateral diffusion process that does not take place until after act 1609. patterning the gate stack.

The process 1600 may continue with act 1606, forming barrier structures for the gate. The barrier structures are ones that provides an obstacle to conduction between the drain and the channel so as to increase threshold voltage. Examples of possible barrier structures include the field oxide structures 703 of FIG. 7, the STI structures 803 of FIG. 8, and the supplemental oxide 901 of FIG. 9.

The process may continue with act 1607, forming a gate stack. The cross-sectional view 1100 of FIG. 11 provides an example. The gate stack includes at least a dielectric layer and an electrode layer. Act 1609 is patterning the gate stack to form gates. The cross-sectional view 1200 of FIG. 12 provides an example.

Act 1610 is an optional step of forming the well of the first doping type by lateral diffusion from the drain sides of the gates and/or forming the region of the second doping type by lateral diffusion from the source sides of the gates. Act 1610 may be used on place of act 1603 and/or act 1605. The lateral diffusion process includes implanting the dopants followed by heat treatment that induces diffusion of the dopants.

Act 1611 is formation of sidewall spacers. The cross-sectional view 1300 of FIG. 13 provides an example.

Act 1613 is doping to form deep p-wells on the drain sides of the gates. Act 1615 is doping to form deep n-wells over the deep p-wells. The source sides may be masked during these doping processes. The cross-sectional view 1400 of FIG. 14 provides an example. These doping processes form embedded diodes that will be disposed under the drain regions of the transistors.

Act 1617 is doping to form source regions and drain regions adjacent the gates. The cross-sectional view 1500 of FIG. 15 provides an example. The source regions and the drain regions may be subjected to a salicide process to form silicide contact layers. Act 1619 is back end of line (BEOL) processing. BEOL processing forms source, drain, gate, and body contact plugs and a metal interconnect structure (not shown) over the semiconductor substrate.

Some aspects of the present disclosure relate to an integrated circuit device that includes a transistor having a channel provided by a semiconductor substrate, a gate electrode directly above the channel, a gate dielectric between the gate electrode and the channel, and source region and drain region on opposite sides of the gate electrode. The source region and the drain regions have a first doping type and the channel has a second doping type, which is opposite the first. A drift region provided by the semiconductor substrate has the first doping type and is in contact with the drain region and the channel. The drift region has a lower dopant concentration than the drain region and extends directly underneath the gate electrode. There is a first deep well of the first doping type directly underneath the drain region. The first deep well has a higher dopant concentration than the drift region. There is a second deep well directly underneath the drain region and the first deep well. The second deep well has the second doping type, has a higher dopant concentration than the drift region, and contacts the first deep well so as to form a diode.

In some embodiments, the drift region separates the drain region from the first deep well. In some embodiments, the diode is operative as a clamping diode for the transistor. In some embodiments, the first deep well is doped with a same alignment as the drain region. In some embodiments, the second deep well is doped with a same alignment as the drain region. In some embodiments, the first deep well extends deeper into the semiconductor substrate than the drift region. In some embodiments, the diode is deeper in the substrate than a bottom of the drift region. In some, wherein the gate electrode is one of multiple fingers. In some embodiments, the first deep well is laterally displaced from the gate electrode. In some embodiments, these is a buried layer directly underneath the second deep well and the gate electrode, wherein the buried layer has the first doping type. In some embodiments, there is a third deep well directly beneath the gate electrode and the drift region and directly above the buried layer, wherein the third deep well has the second doping type and a lower dopant concentration than the second deep well. In some embodiments, the second deep well extends deeper into the semiconductor substrate than the third deep well.

Some aspects of the present disclosure relate to an integrated circuit device that includes a transistor having a gate electrode, a drain region, a drift region and a channel region provided by a semiconductor substrate. The drift region and the drain region have N-type doping. The channel region has P-type doping. The drift region and a P-doped region of the semiconductor substrate directly beneath the drift region form a first vertical PN junction directly beneath the gate electrode. There is a second vertical PN junction provided by an n-well directly over a p-well directly beneath the drain region. The n-well has a higher dopant concentration than the drift region. The p-well has a higher dopant concentration than the P-doped region.

In some embodiments, the second vertical PN junction is deeper than the first vertical PN junction. In some embodiments, the semiconductor substrate comprises an epitaxial layer with P-type doping directly above a buried layer with N-type doping, wherein the buried layer with N-type doping that is directly beneath the transistor. In some embodiments, the transistor is part of a power switching circuit. In some embodiments, the second vertical PN junction lowers a breakdown voltage of the transistor. In some embodiments, the p-well is coupled to a body contact region with P-type doping through portions of the semiconductor substrate that have P-type doping.

Some aspects of the present disclosure relate to a method of forming an integrated circuit device. The method includes doping a semiconductor substrate to form a drift region and a channel region that have a junction adjacent a surface of the semiconductor substrate, forming a gate stack on the semiconductor substrate, patterning the gate stack to form a gate that is directly over the junction, forming a spacer abutting the gate, implanting a deep p-well, implanting a deep n-well directly above the deep p-well, and implanting dopants to form a drain region directly above the deep p-well and the deep n-well. The deep p-well and the deep n-well have higher dopant concentrations than the drift region. In some embodiments, the implants that form the deep p-well and the deep n-well are aligned by the spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit device, the method comprising:

doping a semiconductor substrate to form a drift region and a channel region that have a junction adjacent a surface of the semiconductor substrate;

forming a gate stack on the semiconductor substrate;

patterning the gate stack to form a gate that is over the junction;

implanting first dopants to form a deep p-well, wherein the deep p-well abuts a lightly p-doped region of the semiconductor substrate below the deep p-well;

implanting second dopants to form a deep n-well above the deep p-well so that the deep n-well and the deep p-well have a horizontal interface, wherein the deep n-well has a higher dopant concentration than the drift region; and implanting third dopants to form a drain region, wherein the drain region is disposed directly above the horizontal interface.

2. The method of claim 1, forming a spacer abutting the gate, wherein the spacer provides a mask edge used in the step of implanting the first dopants to form the deep p-well, in the step of implanting the second dopants to form the deep n-well, and in the step of implanting the third dopants to form the drain region.

3. A method of forming an integrated circuit device, the method comprising:

receiving a semiconductor substrate having a surface;

doping an upper portion of the semiconductor substrate to provide a surface adjacent p-well and a surface adjacent n-well;

forming a gate stack on the semiconductor substrate, wherein the gate stack comprises a gate dielectric layer and an electrode layer;

patterning the gate stack to form a gate having a drain side and a source side, wherein the drain side is over the surface adjacent n-well and the source side is over the surface adjacent p-well;

while masking the surface adjacent p-well on the source side, doping on the drain side to form a deep p-well and a deep n-well, wherein the deep n-well extends from the surface adjacent n-well to the deep p-well, the deep p-well is directly below the deep n-well, and the deep p-well extends from the deep n-well to a p-doped portion of the semiconductor substrate that is more lightly p-doped than the deep p-well; and doping to form a drain region and a source region for the gate, wherein the drain region is formed within the surface adjacent n-well and is directly over the deep n-well, and directly over the deep p-well, and the source region is formed within the surface adjacent p-well.

4. The method of claim 3, wherein the semiconductor substrate comprises a buried-n layer below the p-doped portion of the semiconductor substrate that is more lightly p-doped than the deep p-well.

5. The method of claim 3, wherein the p-doped portion of the semiconductor substrate that is more lightly p-doped than the deep p-well extends to the surface adjacent p-well.

6. The method of claim 3, wherein the gate is one of two gates that share the drain region.

7. The method of claim 3, wherein a portion of the surface adjacent n-well is disposed between the drain region and the deep n-well, and is more lightly doped than the drain region and the deep n-well.

8. The method of claim 3, wherein the drain region is narrower than the deep n-well.

9. The method of claim 3, further comprising forming a spacer around the gate, wherein doping on the drain side to form the deep p-well and the deep n-well comprises doping in alignment with the spacer, whereby sidewalls of the deep p-well and the deep n-well are aligned to a sidewall of the spacer.

10. The method of claim 3, further comprising prior to formation of the gate stack, forming an oxide structure at the surface of the semiconductor substrate, wherein the gate forms with the drain side over the oxide structure.

11. The method of claim 10, wherein doping on the drain side to form a deep p-well and a deep n-well comprises doping in alignment with the oxide structure, whereby sidewalls of the deep p-well and the deep n-well are aligned to a sidewall of the oxide structure.

12. The method of claim 11, wherein forming the oxide structure comprises oxidizing the semiconductor substrate to form a field oxide structure.

13. The method of claim 11, wherein forming the oxide structure comprises etching and deposition to form a shallow trench isolation structure.

14. The method of claim 3, wherein the deep n-well extends from the drain region to the deep p-well.

15. The method of claim 3, wherein forming the gate stack comprises a supplemental oxide deposition, wherein the supplemental oxide deposition makes the gate dielectric layer thicker on the drain side of the gate than on the source side of the gate.

16. A method of forming an integrated circuit device, the method comprising:

forming a transistor on a semiconductor substrate having a p-doped region, the transistor comprising a gate electrode, a drain region, a drift region, and a channel region, wherein;

the drift region, the drain region, and the channel region are in the semiconductor substrate;

the drift region is directly over the p-doped region;

the drift region and the drain region have n-type doping;

the channel region has p-type doping; and the drift region and the p-doped region of the semiconductor substrate provide a first vertical PN junction that is beneath the gate electrode; and forming a second vertical PN junction, wherein:

the second vertical PN junction comprises a horizontal interface between an n-well and a p-well;

the n-well is directly over the p-well;

the drain region is disposed directly over the second vertical PN junction;

the n-well is distinct from the drain region;

the n-well has a higher dopant concentration than the drift region;

the p-well has a higher dopant concentration than the p-doped region; and the p-well extends to the p-doped region.

17. The method of claim 16, wherein a portion of the drift region having a lower dopant concentration than the drain region and the n-well is disposed between the drain region and the n-well.

18. The method of claim 16, wherein the second vertical PN junction is deeper than the first vertical PN junction.

19. The method of claim 16, wherein the second vertical PN junction lowers a breakdown voltage of the transistor.

20. The method of claim 16, wherein the p-well is electrically coupled to a body contact region with p-type doping through portions of the semiconductor substrate that have p-type doping.

* * * * *